(12) United States Patent
Kanayama et al.

(10) Patent No.: US 6,913,653 B2
(45) Date of Patent: *Jul. 5, 2005

(54) CLEANING AND ETCHING METHODS AND THEIR APPARATUSES

(75) Inventors: Tokiko Kanayama, Amagasaki (JP); Hiroaki Kouno, Yawata (JP)

(73) Assignee: Sumitomo Precision Products Co., LTD, Hyogo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/451,206

(22) PCT Filed: Dec. 17, 2001

(86) PCT No.: PCT/JP01/11059

§ 371 (c)(1),
(2), (4) Date: Jul. 23, 2003

(87) PCT Pub. No.: WO02/50884

PCT Pub. Date: Jun. 27, 2002

(65) Prior Publication Data

US 2004/0069318 A1 Apr. 15, 2004

(30) Foreign Application Priority Data

Dec. 18, 2000 (JP) .................................. PCT/JP00/08974

(51) Int. Cl.[7] ................................................. B08B 5/00
(52) U.S. Cl. ........................... 134/2; 134/21; 134/22.1; 134/22.11; 134/22.12; 134/26; 134/31; 134/34; 134/36; 134/37; 134/42; 134/30
(58) Field of Search ............................ 134/2, 21, 22.1, 134/22.11, 22.12, 26.3, 31, 34, 36, 37, 42

(56) References Cited

U.S. PATENT DOCUMENTS

| 5,298,112 | A | | 3/1994 | Hayasaka et al. |
|---|---|---|---|---|
| 5,716,495 | A | * | 2/1998 | Butterbaugh et al. ........ 438/708 |
| 6,124,211 | A | * | 9/2000 | Butterbaugh et al. ........ 438/708 |
| 6,409,876 | B1 | * | 6/2002 | McQuarrie et al. .... 156/345.29 |
| 2002/0007246 | A1 | * | 1/2002 | Baur et al. .................. 701/209 |
| 2002/0011463 | A1 | * | 1/2002 | Buskirk et al. ................ 216/64 |
| 2004/0069318 | A1 | * | 4/2004 | Kanayama et al. .......... 134/1.3 |

FOREIGN PATENT DOCUMENTS

| EP | 305946 A1 | 3/1989 |
|---|---|---|
| EP | 878824 A1 | 11/1989 |
| JP | 2-49425 A1 | 2/1990 |
| JP | 08-274072 | 10/1996 |
| JP | 10-209088 | 8/1998 |
| JP | 10-317169 A1 | 12/1998 |
| JP | 2000-164559 A1 | 6/2000 |
| JP | 2001-102345 | 4/2001 |
| KR | 9207449 B1 | 9/1992 |
| KR | 98086769 A1 | 12/1998 |
| WO | WO-98/47172 A1 | 10/1998 |

* cited by examiner

Primary Examiner—Sharidan Carrillo
(74) Attorney, Agent, or Firm—Darby & Darby

(57) ABSTRACT

A cleaning method for removing fats, oils, and silicon small particles, which are conventionally difficult to remove, adhering to devices and carriers used to manufacture a semiconductor wafer or a semiconductor device. An etching method is also disclosed. $XeF_2$ gas produced by sublimation is made to contact with an object to be cleaned in a vacuum atmosphere so as to decompose and gasify the oils and fats and to remove silicon small particles by etching. Prior to the cleaning, when a trace amount of residual water is left in the vacuum atmosphere, $H_2O$ reacts with $XeF_2$, and HF is produced. For example, a native oxide $SiO_2$ formed on the surface of silicon small particles can be removed, and $XeF_2$ directly reacts with silicon, therby enabling etching. The cleaning etching rates are extremely high.

7 Claims, 2 Drawing Sheets

CLEANING AND ETCHING METHODS AND THEIR APPARATUSES

This is a U.S. national phase application under 35 U.S.C. §371 of International Patent Application No. PCT/JP01/11059, filed Dec. 17, 2001, and claims the benefit of International Patent Application No. PCT/JP00/08974 filed Dec. 18, 2000. The International Application was published in Japanese on Jun. 27, 2002 as WO 02/50884 A1, under PCT Article 21(2).

TECHNICAL FIELD

The present invention relates to, in a semiconductor wafer or semiconductor device manufacturing process, methods and apparatuses for removing by cleaning dust from a silicon wafer, extremely minute silicon pieces that have become stuck in a carrier, or an oil film or the like caused by oily components or the like that have leaked out from a pump or the like of any of various manufacturing apparatuses installed in a clean room or sebum generated from workers, and more specifically relates to a dry cleaning method, an etching method, and apparatuses therefor that enable the removal of polymer, grease, metal, an native oxide on silicon and so on through a method using $XeF_2$ gas.

BACKGROUND ART

In the manufacture of semiconductor wafers and semiconductor devices, regarding manufacturing apparatuses therefor, to prevent the processed products being contaminated with various types of soiling, attach ed substances, and so on, or to carry out vapor deposition processes, hermetically sealed chambers are primarily used, and an apparatus constitution in which a plurality of such chambers are arranged connected together is widely used.

Moreover, in such manufacture, housing means called a wafer carrier is used for conveying wafers and transferring the wafers between apparatuses, or a handling apparatus or the like for holding the wafers one at a time is used. Such a wafer carrier has a constitution in which a large number of semiconductor wafers are held in a line by means of a large number of grooves provided in an inside surface of the wafer carrier, and minute silicon dust is liable to be generated.

Every time it is required to increase the degree of integration of semiconductor devices, it is required to reduce the amount of attached matter on semiconductor wafers, and hence there is an increase in the required degree of cleanliness in the various process apparatuses and so on. Consequently, minute silicon dust, and also oil films and so on caused by oily components or the like that have leaked out from a pump or the like of any of various manufacturing apparatuses installed in a clean room or sebum generated from workers in the clean room, which are difficult to remove, are the most loathed contaminants.

In the case of cleaning a series of device manufacturing apparatuses that have been set up using a cleaning liquid containing, for example, a surfactant for removing oily components and so on, another way of cleaning is required to remove the surfactant and so on, and hence contamination occurs in chain-like fashion; in general, a cleaning liquid that does not contain a surfactant is thus used, and hence it is extremely difficult to remove the above-mentioned oil films and so on.

Moreover, as insertion of silicon wafers into and carrying out of silicon wafers from the various apparatuses is continuously carried out, it is impossible to avoid extremely minute silicon dust becoming attached inside the apparatuses; the surface of this dust is oxidized over time, whereby a tough oxide film is produced.

Furthermore, wafer carriers of which the inside and outside surfaces have become soiled through repeated use are periodically cleaned since this soiling will cause contamination of the semiconductor wafers themselves. Up until now the cleaning of wafer carriers has been carried out through automatic cleaning using a high-pressure jet, Megasonic cleaner or the like, or hand brush cleaning using an organic solvent. However, it has not been easy to remove extremely minute silicon pieces that have become stuck in a carrier.

DISCLOSURE OF THE INVENTION

It is an object of the present invention to provide a cleaning method and an apparatus therefor which, in the case of any of various apparatuses, a carrier or the like used in the manufacture of semiconductor wafers or semiconductor devices, are capable of removing minute silicon dust attached and accumulated inside the apparatuses, or removing by cleaning minute silicon pieces and grease that are conventionally difficult to remove.

Moreover, it is an object of the present invention to provide an etching method and an apparatus therefor which, during the manufacture of semiconductor wafers and semiconductor devices, are capable of removing an oxide film on the surface of a silicon wafer and also continuously etching the silicon.

Aiming for a method capable of removing by cleaning silicon dust and grease which is attached to an apparatus and is difficult to remove, minute silicon pieces and silicon oxide pieces that have become stuck in a carrier, and so on, for example capable of cleaning away such substances even from the inside of an airtight chamber, the present inventors carried out various studies into decomposed substances such as the above-mentioned grease and the like, and as a result discovered that if $XeF_2$ gas obtained by sublimation is made to come into contact with and act on an article to be cleaned in a vacuum atmosphere, then the above-mentioned grease and the like can be decomposed and vaporized, and moreover silicon pieces and the like can be removed by etching.

Moreover, the present inventors discovered that if the above-mentioned vacuum atmosphere is made to contain a trace of water, then the $H_2O$ and the $XeF_2$ in the atmosphere react with one another to produce HF, and hence for example an native oxide on silicon formed on the surface of silicon pieces or the like can be removed, and then subsequently the silicon can be etched through the $XeF_2$ acting directly on the silicon in an atmosphere not containing water; the series of cleaning and etching reactions is extremely rapid, and hence cleaning and etching can be carried out in a reduced time.

Furthermore, the present inventors discovered that if the two steps are carried out in succession, i.e. the amount of $SiO_2$ oxide film formed on silicon pieces to be removed is estimated, a prescribed amount of water is made to remain behind in or is added to the atmosphere, and $XeF_2$ gas is supplied in, thus first removing the native oxide on silicon formed on the surface of the silicon pieces or the like, and then after the water has been consumed the $XeF_2$ gas is made to act directly on the silicon pieces, thus removing the silicon itself by etching, then it becomes possible to clean the inside of an apparatus for manufacturing so-called silicon wafers, semiconductor devices or the like; moreover, if for example a pre-existing device manufacturing apparatus is provided with an $XeF_2$ gas supply apparatus and a dehumidification or humidification apparatus, then completely dry cleaning of the apparatus can be suitably carried out; the present invention was thus accomplished.

That is, the present invention provides a cleaning method and an etching method, characterized by causing $XeF_2$ gas to come into contact with and act on an article to be cleaned in a reduced-pressure or vacuum atmosphere containing a trace of water or having had a prescribed amount of water added thereto, and then causing $XeF_2$ gas to come into contact with and act on the article to be cleaned in a vacuum atmosphere not containing water.

Moreover, the present inventors also propose a cleaning method and an etching method characterized in that, in the above methods, the article to be cleaned (article to be processed) is a gas passageway or the inside of any of various chambers of a semiconductor wafer or device manufacturing apparatus, or any of a semiconductor wafer, a semiconductor device, and a carrier thereof.

Furthermore, the present inventors also propose cleaning and etching apparatuses in which a publicly-known silicon wafer or device manufacturing apparatus is provided with $XeF_2$ gas supply means and dehumidification and/or humidification means.

The present invention provides a cleaning method in which $XeF_2$ gas contacts and acts on an article to be cleaned in a reduced-pressure or vacuum atmosphere containing a required amount of water. Then, $XeF_2$ gas contacts and acts on the article to be cleaned in a reduced-pressure or vacuum atmosphere not containing water.

According to an embodiment of the invention described above, the $XeF_2$ gas can be supplied continuously in the step using the atmosphere containing water and the step using the atmosphere not containing water.

The present invention also provides a cleaning apparatus including a pressure-reducing/vacuum means; $XeF_2$ gas generating means; and means for making an atmosphere in the apparatus contain water, wherein $XeF_2$ gas contacts and acts on an article to be cleaned in a reduced-pressure or vacuum atmosphere containing a required amount of water. Then, the $XeF_2$ gas contacts and acts on the article to be cleaned in a reduced-pressure or vacuum atmosphere not containing water.

Furthermore, the present invention provides an etching method in which $XeF_2$ gas contacts and acts on an article to be processed in a reduced-pressure or vacuum atmosphere containing a required amount of water. Then, $XeF_2$ gas contacts and acts on the article to be processed in a reduced-pressure or vacuum atmosphere not containing water.

According to an embodiment of the invention described above, the $XeF_2$ gas can be supplied continuously in the step using the atmosphere containing water and the step using the atmosphere not containing water.

The present invention also provides an etching apparatus including a pressure-reducing/vacuum means; $XeF_2$ gas generating means; and means for making an atmosphere in the apparatus contain water, wherein $XeF_2$ gas contacts and acts on an article to be processed in a reduced-pressure or vacuum atmosphere containing a required amount of water. Then, the $XeF_2$ gas contacts and acts on the article to be processed in a reduced-pressure or vacuum atmosphere not containing water.

BEST MODE FOR CARRYING OUT THE INVENTION

Figure 1:
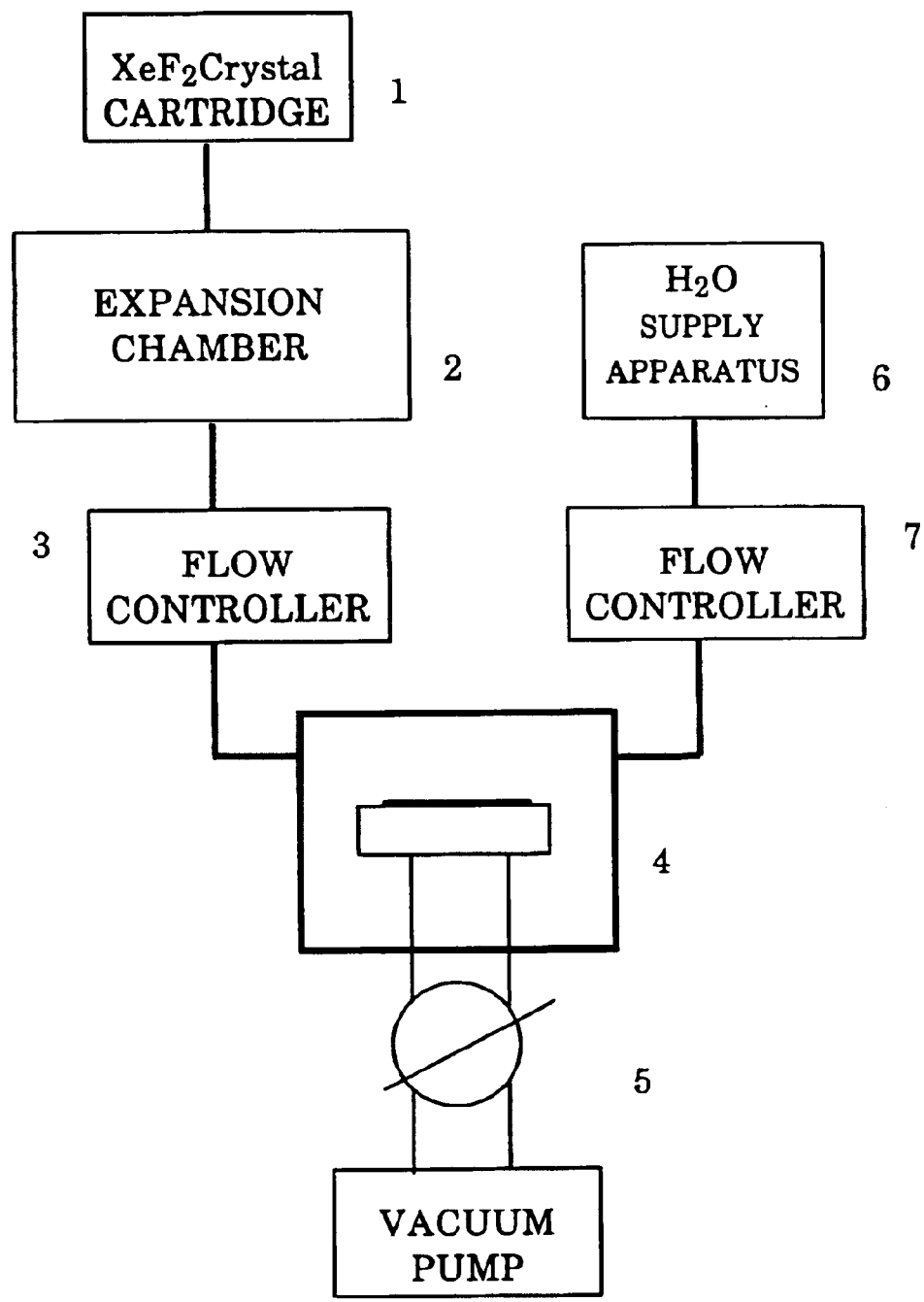
FIG. 1 is an explanatory drawing showing a constitution in which an apparatus for continuously supplying $XeF_2$ gas is connected to a chamber of a device manufacturing apparatus.

In the present invention, $XeF_2$ is used by making crystals thereof into a gas at raised temperature or in a reduced-pressure or vacuum atmosphere; conventionally, $XeF_2$ gas is known as a gas for isotropic etching of silicon. The present inventors discovered that such $XeF_2$ gas has a function of decomposing and vaporizing grease, and the present invention utilizes this effectively.

Moreover, the present inventors discovered that if $XeF_2$ gas is reacted with a trace of residual water or added water in the atmosphere to produce HF gas, and for example an $SiO_2$ oxide film on a silicon wafer is removed using the HF gas, and then etching of the silicon is carried out using the $XeF_2$ gas, then the total processing time can be shortened; the present invention utilizes this effectively.

In the case of cleaning the inside of a gas passageway and/or the inside of any of various chambers of a semiconductor wafer or device manufacturing apparatus, a constitution is adopted such that it is possible to introduce into the apparatus using a separate pre-existing gas passageway $XeF_2$ gas obtained by subliming $XeF_2$ crystals in, for example, a low-pressure expansion chamber; the inside of the chamber or passageway to be cleaned is, for example, evacuated, and setting is carried out such that a trace of water remains behind, and then the $XeF_2$ gas is introduced, whereby first HF gas is produced, and hence an oxide film on silicon dust attached to the inside of the chamber or passageway to be cleaned is removed; then, after the water has run out, the silicon dust itself and grease attached to the inside of the chamber or passageway to be cleaned are decomposed and vaporized by the supplied $XeF_2$ gas, and after that evacuation is carried out, thus completing exhaustion of the $XeF_2$ gas; cleaning of the inside of the chamber or passageway can thus be achieved.

In the case of cleaning a carrier, by adding an $XeF_2$ processing step that also combines drying to a conventional carrier cleaning process, it becomes possible to remove an native oxide on silicon on extremely minute silicon pieces that could not be removed conventionally, and then remove the silicon pieces themselves and an oil film.

For example, the inside of a dry processing chamber housing the carrier is evacuated, $XeF_2$ gas is introduced in from an $XeF_2$ gas supply unit, and is thus made to come into contact with and act on the carrier and hence decompose and vaporize grease attached to the carrier, and moreover etching of silicon pieces attached to the carrier is carried out. When blowing on the gas in this processing process, only the $XeF_2$ gas is blown on.

During the above-mentioned evacuation, a trace of residual water is left behind, whereby the $H_2O$ and the $XeF_2$ react with one another to produce HF, and hence the native oxide on the silicon pieces is removed in advance; the etching by the $XeF_2$ gas thus becomes more effective.

Subsequently, evacuation is carried out, thus completing exhaustion of the $XeF_2$ gas, and then the pressure inside the chamber is adjusted, thus completing the cleaning of the carrier; a cleaning effect better than with a conventional cleaning technique can be obtained.

As the $XeF_2$ gas supply unit in the present invention, an expansion chamber constituted as indicated in the examples is preferably used. That is, $XeF_2$ gas is obtained by subliming $XeF_2$ crystals in a low-pressure expansion chamber, and a constant amount of the $XeF_2$ gas is maintained, or every time the $XeF_2$ gas is generated the $XeF_2$ gas is supplied elsewhere due to the $XeF_2$ processing, whereby the pressure inside the expansion chamber drops, and hence the crystals naturally start to sublime again; it thus becomes possible to supply the $XeF_2$ gas continuously.

Moreover, a conventional publicly-known pulse process in which gas supply and exhaustion are carried out alternately can also be used with the present invention, although there is a problem of the processing time becoming long.

As the means for leaving behind the required amount of water in or supplying the required amount of water into the gas passageway or chamber, for example vacuum-producing means such as a publicly-known vacuum pump can be used together with any of various publicly-known dehumidification means and/or humidification means; it is also possible to add separately generated water vapor using an ordinary gas flow controller. Furthermore, cooling means is also effective, for example in the case of carrying out etching of a silicon wafer, it is possible to cool the silicon wafer at the same time as producing the vacuum, thus uniformly attaching and freezing water onto the wafer surface, and hence making water remain behind, or it is possible to make water remain behind in required places. Here, regarding the required amount of water made to remain behind or added using any of the various means, in the case that gas is continuously supplied using the above-mentioned $XeF_2$ gas supply unit, after the water has been consumed in the chamber or the like, a step involving $XeF_2$ gas alone is switched over to.

When etching a silicon wafer according to the present invention, to remove an oxide film formed on the surface thereof, a trace of residual water in the atmosphere is utilized or a prescribed amount of water added to the atmosphere is reacted with the $XeF_2$ gas to produce HF gas; however, the rate of etching by the HF gas is different for a native oxide and a thermal oxide film, and hence for example the concentration of the HF gas itself can be changed, and thus when carrying out the etching various conditions such as the amounts of the $XeF_2$ gas and the water can be selected as appropriate.

EXAMPLES

Example 1

An $XeF_2$ gas continuous supply apparatus was connected to a chamber of a publicly-known device manufacturing apparatus as shown in FIG. 1. Specifically, the continuous supply apparatus was constituted by connecting an $XeF_2$ crystal cartridge 1 to an expansion chamber 2, and then connecting via a flow controller 3 to a pre-existing gas supply pipe leading to a process chamber 4.

In addition to a process gas supply pipe, not shown in the drawing, a vacuum pump apparatus 5 was connected to the process chamber 4, whereby the atmosphere in the chamber 4 could be controlled as desired. Consequently, it becomes possible to accurately control the flow rate of the $XeF_2$ gas introduced into the process chamber 4, and moreover it becomes possible to control the gas flow rate and the process chamber 4 pressure independently of one another.

The inside of the process chamber 4 is evacuated from an air atmosphere to a vacuum, with a required amount of residual water being left behind (method 1), or else water vapor is added via a flow controller 7 from an $H_2O$ gas supply apparatus 6 using a separate gas pipeline as shown in the drawing, whereby the amount of water in the atmosphere in the chamber 4 is controlled in advance to be a prescribed amount (method 2). Here, both of these methods (method 1, method 2) were implemented, changing over the chamber.

Next, $XeF_2$ crystals are sublimed in the expansion chamber 2 at a pressure below the sublimation point to obtain $XeF_2$ gas, and once the pressure of the $XeF_2$ reaches the sublimation point (a few Torr), the $XeF_2$ gas is introduced into the process chamber 4.

Moreover, a method 3 in which the water vapor is added via the flow controller 7 from the $H_2O$ gas supply apparatus 6 at the same time as introducing the $XeF_2$ into the process chamber 4 was also implemented.

Here, at an initial stage of gas introduction when water is already present in the process chamber 4 (method 1, method 2), or when water is introduced at the same time as the $XeF_2$ (method 3), the $XeF_2$ reacts with the water to produce HF; a thermal oxide film or the like on the surface of silicon dust attached to an exhaust system and in the chamber 4 was thus removed by cleaning.

After that, as the $XeF_2$ is supplied and hence the pressure inside the expansion chamber drops, the crystals naturally start to sublime again, and hence the $XeF_2$ gas is supplied continuously; once the water in the process chamber 4 runs out, or the addition of the water vapor from the flow controller 7 is stopped, the generation of HF ceases, and thus cleaning by the $XeF_2$ gas is then carried out; metal, insulating material and polymer attached to the exhaust system and in the chamber 4 could thus be removed by cleaning.

In FIG. 1, a constitution is shown in which the $XeF_2$ gas supply system is connected directly to the process chamber 4; however, when an apparatus was manufactured having a constitution in which the $XeF_2$ gas supply system, or this and also the water vapor supply system are connected to gas piping, not shown in the drawing, for supplying the process gas to the process chamber 4, and methods 1 to 3 described above were implemented, it was possible to remove by cleaning silicon dust, polymer and so on that was attached in large amounts inside the process gas piping leading to the chamber 4 and in the vicinity of a connecting part between this piping and the chamber 4.

Example 2

Using a process chamber having an $XeF_2$ gas continuous supply apparatus as used in Example 1, etching of monocrystalline silicon wafers for devices was carried out. Note that, although not shown in the drawing, in the example of the apparatus in FIG. 1, the $XeF_2$ gas supply port was disposed close to a stage on which the silicon wafer was placed, and a constitution preferable for an etching apparatus was adopted such that the $XeF_2$ gas would flow uniformly over the wafer surface.

Here, 3 $\mu$m-deep pattern formation with 100 mm spacing was carried out on a 4-inch wafer. The $XeF_2$ etching process conditions were $XeF_2$ gas, 15 sccm, and a pressure of 20 Pa (150 mTorr).

Evacuation was carried out to create a prescribed atmosphere, and before commencing the etching, $H_2O$ was added for 5 seconds at a flow rate of 50 sccm from a separate gas introduction port without carrying out exhaustion, thus introducing water vapor into the process chamber. Then, the $XeF_2$ gas was introduced in continuously while carrying out exhaustion, thus carrying out the etching.

Moreover, for comparison, when carrying out the above etching process, the etching was carried out by continuously introducing $XeF_2$ gas, without introducing water vapor before commencing the etching.

In the case of the etching process of the present invention in which water vapor was introduced before commencing the etching, the total process time was 15 minutes. Moreover, in the case of the etching process in which water vapor was not introduced for comparison, the total process time was 18 minutes.

A 5 Å- to 10 Å-thick native oxide was formed on the silicon wafer, but in the case of the etching process of the present invention, it is thought that because water vapor was introduced before commencing the etching and hence HF was generated through reaction with the $XeF_2$, the native oxide on the wafer surface was removed almost instantaneously, and thus the etching by the $XeF_2$ gas was carried out without delay, and hence the etching was carried out at the natural etching rate of silicon by $XeF_2$ gas, i.e. 0.2 μm/min.

However, in the case of the etching process of the comparative example, the $XeF_2$ gas first etches the native oxide, but the etching rate of an $SiO_2$ film by $XeF_2$ gas is extremely slow; a large difference in the total process time thus arose.

Example 3

Figure 2:
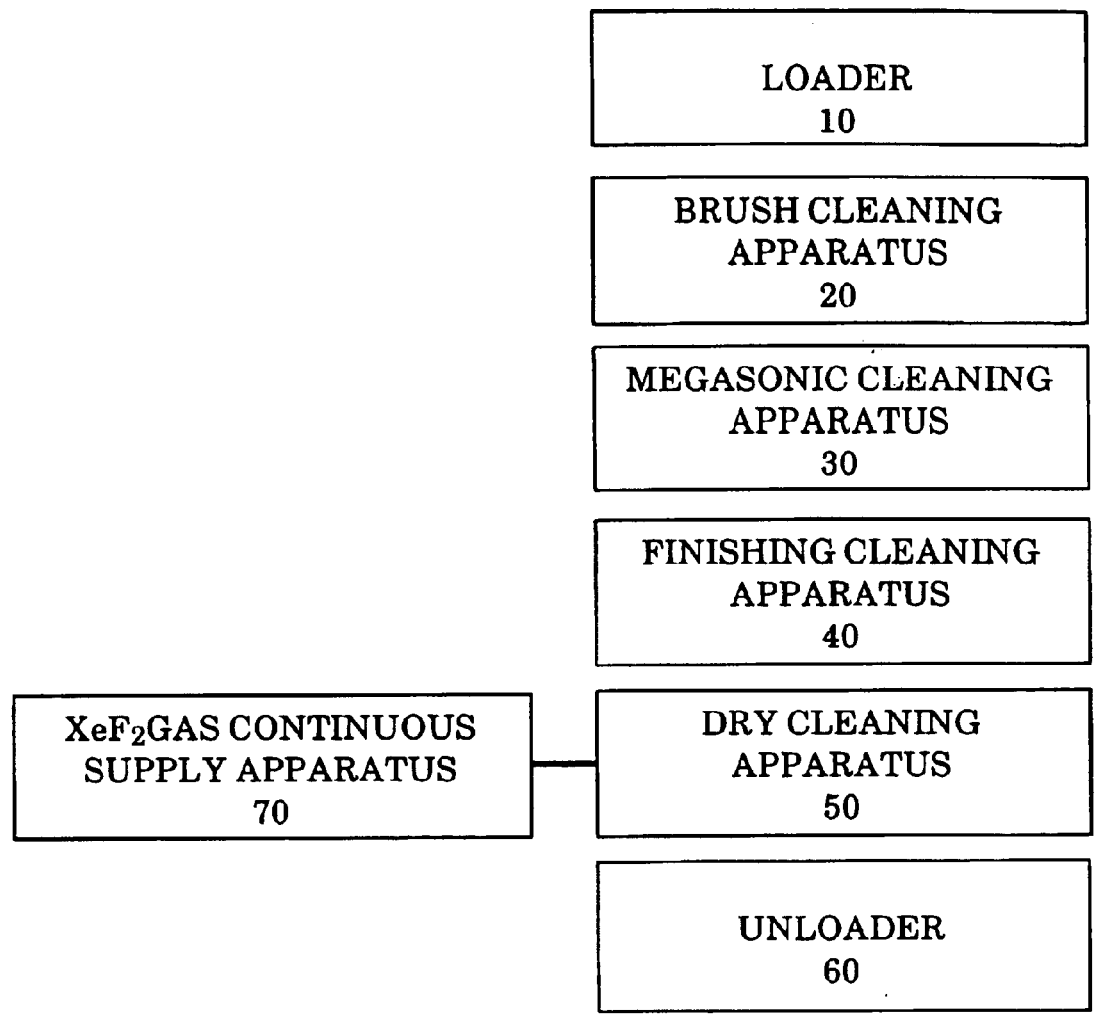
FIG. 2 is an explanatory drawing showing a carrier cleaning process.

As shown in FIG. 2, a wafer carrier automatic cleaning apparatus according to the present invention has a constitution in which a loader 10, a brush cleaning apparatus 20, an ultrasonic cleaning apparatus 30, a finishing cleaning apparatus 40, a dry cleaning apparatus 50, and an unloader 60 are arranged in tandem.

A wafer carrier to be cleaned is conveyed into the cleaning apparatuses by the loader 10. The wafer carrier that has been conveyed in is then carried to the brush cleaning apparatus 20 by a robot. The brush cleaning apparatus 20 has a cleaning bath and a cleaning robot attached thereto. A cleaning liquid comprising, for example, a mixture of pure water and a neutral detergent is introduced in from a bottom part of the cleaning bath and overflows, whereby the liquid level is kept constant. The constitution is such that a rotating table is provided in the bottom part of the cleaning bath, and the carrier to be cleaned is supported in the bath in a state immersed in the cleaning liquid with an opening part thereof facing upward, and is rotated. The cleaning robot has rotating brushes, and brushes inside and outside surfaces of the carrier.

Once the brush cleaning of the carrier has been completed, the carrier is conveyed to the ultrasonic cleaning apparatus 30 by the robot. The ultrasonic cleaning apparatus 30 is able to clean the carrier using ultrasound generated in warm pure water that has been heated to 40 to 60° C. Once the ultrasonic cleaning has been completed, the carrier is conveyed to the finishing cleaning apparatus 40; the finishing cleaning apparatus 40 holds pure water that is continuously supplied in a laminar flow state from a bottom part of a cleaning bath of the finishing cleaning apparatus 40 and overflows, and the carrier is immersed in this pure water, and is thus subjected to finishing cleaning. Through the ultrasonic cleaning and the finishing cleaning, minute pieces of foreign matter and soiling remaining on the surfaces of the carrier are removed.

An $XeF_2$ gas continuous supply apparatus 70 as used in Example 1 is connected to the dry cleaning apparatus 50. In the dry cleaning apparatus 50, first the carrier is rotated at approximately 1,000 rpm and thus spin-dried. Next, the inside of the chamber is evacuated (30 to 60 sec), whereby the pressure is reduced and water is removed from the surfaces of the carrier. Furthermore, under a 133.3 Pa to 266.3 Pa (1 Torr to 2 Torr) atmosphere, $XeF_2$ gas is introduced in from the $XeF_2$ gas supply apparatus, whereby cleaning processing is carried out (60 sec).

First, the introduced $XeF_2$ gas reacts with residual water in the chamber to produce HF, and thus an oxide film on the surface of extremely minute silicon pieces that have become stuck in the carrier surfaces is removed by cleaning. Then, the supplied $XeF_2$ acts directly on the carrier; the minute silicon pieces and also attached metal, insulating material, polymer and so on could thus be removed by cleaning.

After that, evacuation is carried out (30 to 60 sec), thus exhausting the $XeF_2$. Then, $N_2$ is vented (20 to 30 sec) to adjust the pressure inside the chamber, and then the carrier is taken out from the dry cleaning apparatus 50 by another robot, and carried to the unloader 60 and stored.

In the dry cleaning apparatus 50, metal, insulating material, polymer and so on, and also extremely minute silicon pieces that have become stuck in the carrier surfaces, which could not be removed by conventional brush cleaning, could be removed.

INDUSTRIAL APPLICABILITY

With the present invention, using HF generated from $XeF_2$ gas and a prescribed amount of water in the atmosphere that has been controlled by being left behind or added, it is possible to remove a silicon oxide film on the surface of minute silicon dust attached to a gas passageway or the inside of any of various chambers of a semiconductor wafer or semiconductor device manufacturing apparatus, or any of a semiconductor wafer, a semiconductor device, and a carrier thereof; subsequently, using the $XeF_2$ gas, it is possible to remove the silicon dust itself, and selectively etch polymer, grease, metal and so on, which have been difficult to remove conventionally; it thus becomes possible to clean the inside of any of the above apparatuses in a relatively short time and by a dry cleaning method.

With the present invention, by providing a pre-existing semiconductor wafer or semiconductor device manufacturing apparatus with an $XeF_2$ gas continuous supply apparatus and means for making the atmosphere contain water such as a dehumidification or humidification apparatus, completely dry cleaning of the apparatus can be suitably carried out.

In particular, in the manufacture of semiconductor wafers and semiconductor devices these days, an extremely high degree of cleanliness is required for the atmosphere in the apparatus; however, with the present invention, there is an advantage that this can be coped with, since extremely minute silicon dust, polymer and the like, which have been difficult to remove conventionally, can be removed through completely dry cleaning.

Moreover, with the present invention, by using a method in which the $XeF_2$ gas is supplied continuously, it is possible to remove an $SiO_2$ oxide film such as a native oxide formed on a silicon wafer using HF gas generated from the $XeF_2$ gas and water in the atmosphere, and then etch the silicon using the $XeF_2$ gas; the total processing time of the etching process can thus be shortened.

What is claimed is:

1. A cleaning method comprising the steps of:
   causing $XeF_2$ gas to contact and act on an article containing silicon in a reduced-pressure or vacuum atmosphere containing a required amount of water to remove a $SiO_2$ film formed on the silicon of the article, and then
   causing $XeF_2$ gas to contact and act on the article in a reduced-pressure atmosphere not containing water or vacuum atmosphere not containing water.

2. The cleaning method according to claim 1, wherein the $XeF_2$ gas is supplied continuously in both the step using the atmosphere containing water and the step using the atmosphere not containing water.

3. The cleaning method according to claim 1, wherein the article to be cleaned is a member of the group consisting of a gas passageway and an inside of a chamber of a semiconductor wafer manufacturing apparatus or a semiconductor device manufacturing apparatus.

4. The cleaning method according to claim 1, wherein the article to be cleaned is a member of the group consisting of a semiconductor wafer, a semiconductor device, and a carrier thereof.

5. An etching method comprising the steps of:

causing $XeF_2$ gas to contact and act on an article containing silicon in a reduced-pressure or vacuum atmosphere containing a required amount of water to remove a $SiO_2$ film formed on the silicon of the article, and then causing $XeF_2$ gas to contact and act on the article to be processed in a reduced-pressure atmosphere not containing water or a vacuum atmosphere not containing water.

6. The etching method according to claim 5, wherein the $XeF_2$ gas is supplied continuously in both the step with the atmosphere containing water and the step with the atmosphere not containing water.

7. The etching method according to claim 5, wherein the article to be processed is a silicon wafer.

* * * * *